(12) United States Patent
Narui et al.

(10) Patent No.: US 10,377,110 B2
(45) Date of Patent: *Aug. 13, 2019

(54) COPPER CLAD LAMINATE

(71) Applicant: UBE INDUSTRIES, LTD., Ube-shi, Yamaguchi (JP)

(72) Inventors: Kohji Narui, Ube (JP); Masafumi Hashimoto, Ube (JP); Takuro Kochiyama, Ube (JP)

(73) Assignee: UBE INDUSTRIES, LTD., Ube-Shi, Yamaguchi (JP)

( * ) Notice: Subject to any disclaimer, the term of this patent is extended or adjusted under 35 U.S.C. 154(b) by 785 days.

This patent is subject to a terminal disclaimer.

(21) Appl. No.: 14/961,720

(22) Filed: Dec. 7, 2015

(65) Prior Publication Data

US 2016/0082703 A1 Mar. 24, 2016

Related U.S. Application Data

(63) Continuation of application No. 11/910,610, filed as application No. PCT/JP2006/307122 on Apr. 4, 2006, now abandoned.

(30) Foreign Application Priority Data

Apr. 4, 2005 (JP) ................. 2005-107408

(51) Int. Cl.
| | |
|---|---|
| B32B 15/08 | (2006.01) |
| B32B 15/20 | (2006.01) |
| B32B 27/28 | (2006.01) |
| H05K 1/03 | (2006.01) |
| H05K 3/02 | (2006.01) |
| B29C 48/08 | (2019.01) |
| B32B 37/04 | (2006.01) |
| B29K 79/00 | (2006.01) |
| B29K 105/00 | (2006.01) |
| B29C 48/18 | (2019.01) |

(52) U.S. Cl.
CPC .............. *B32B 15/08* (2013.01); *B29C 48/08* (2019.02); *B32B 15/20* (2013.01); *B32B 27/281* (2013.01); *H05K 1/0346* (2013.01); *H05K 3/022* (2013.01); *B29C 48/18* (2019.02); *B29K 2079/08* (2013.01); *B29K 2105/256* (2013.01); *B32B 37/04* (2013.01); *B32B 2250/03* (2013.01); *B32B 2250/40* (2013.01); *B32B 2264/0214* (2013.01); *B32B 2307/306* (2013.01); *B32B 2307/54* (2013.01); *B32B 2309/02* (2013.01); *B32B 2309/105* (2013.01); *B32B 2311/12* (2013.01); *B32B 2379/08* (2013.01); *B32B 2457/00* (2013.01); *B32B 2457/08* (2013.01); *H05K 1/036* (2013.01); *H05K 3/025* (2013.01); *H05K 2201/0129* (2013.01); *H05K 2201/0154* (2013.01); *H05K 2201/0212* (2013.01); *H05K 2201/0355* (2013.01); *H05K 2203/068* (2013.01); *Y10T 428/31681* (2015.04)

(58) Field of Classification Search
CPC .................. B32B 15/08; B32B 27/281; B32B 2264/0214
See application file for complete search history.

(56) References Cited

U.S. PATENT DOCUMENTS

| | | | |
|---|---|---|---|
| 5,507,903 A | 4/1996 | Yamamori et al. | |
| 5,958,209 A | 9/1999 | Sakai et al. | |
| 6,231,742 B1 | 5/2001 | Sano et al. | |
| 6,372,061 B1 | 4/2002 | Hatano et al. | |
| 6,699,572 B2 | 3/2004 | Yamamoto et al. | |
| 7,186,456 B2 | 3/2007 | Hashimoto et al. | |
| 2004/0105989 A1 | 6/2004 | Ohta et al. | |
| 2004/0110015 A1 | 6/2004 | Narui et al. | |
| 2005/0074592 A1 | 4/2005 | Hashimoto et al. | |
| 2006/0154037 A1* | 7/2006 | Shimokawa ............ B32B 9/005 428/216 |
| 2007/0062722 A1 | 3/2007 | Tanaka et al. | |

FOREIGN PATENT DOCUMENTS

| | | |
|---|---|---|
| JP | 62-068852 | 3/1987 |
| JP | 62-068853 | 3/1987 |
| JP | 06-100714 A | 4/1994 |
| JP | 06-145378 | 5/1994 |
| JP | 06-192446 A | 7/1994 |
| JP | 2001-270039 A | 10/2001 |
| JP | 2002-270651 A | 9/2002 |
| JP | 2002-316386 A | 10/2002 |
| JP | 2003-071984 A | 3/2003 |
| JP | 2005-126707 | 5/2005 |
| JP | 2005-280163 | 10/2005 |
| KR | 10-0229637 | 3/1993 |

OTHER PUBLICATIONS

Yamanishi, Treated Rolled Copper Foil for Flexible Printed Circuit Board, Journal of the Japan Institute of Electronics Packaging, Aug. 1, 2004. (Year: 2004).*

(Continued)

Primary Examiner — Monique R Jackson

(74) Attorney, Agent, or Firm — Knobbe, Martens, Olson & Bear, LLP

(57) ABSTRACT

A copper-clad laminate is prepared by laminating a copper foil on one side or both sides of a polyimide film by thermocompression bonding. The flexibility of the copper-clad laminate is remarkably improved by employing a polyimide film having a thickness of 5 to 20 μm and a copper foil having a thickness of 1 to 18 μm.

10 Claims, 1 Drawing Sheet

(56) References Cited

OTHER PUBLICATIONS

Nippon Denkai, Ltd., Products, downloaded from www.nippon-denkai.co.jp/english/product on Aug. 16, 2018. (Year: 2018).*
Machine translation of JP06-100714A, published Apr. 12, 1994. (Year: 1994).*
Search Report and Written Opinion issued by the Australian Patent Office dated Feb. 9, 2009 for Application No. SG 2007-16542-6.
International Preliminary Report on Patentability for PCT/JP2006/307122 dated Oct. 18, 2007.
First Office Action received in corresponding Chinese Patent Application No. 200680017682.0, dated Sep. 7, 2010 in 14 pages.
International Search Report for PCT/JP2006/307122 dated Jul. 11, 2006.
Office Action dated Apr. 4, 2007 in U.S. Appl. No. 11/910,610.
Office Action dated Sep. 15, 2010 in U.S. Appl. No. 11/910,610.
Office Action dated Jul. 20, 2011, in corresponding Japanese Application No. 2007-511237.
Final Office Action dated Oct. 18, 2011 in U.S. Appl. No. 11/910,610.
Final Office Action dated Oct. 5, 2012 in U.S. Appl. No. 11/910,610.
Final Office Action dated Dec. 20, 2013 in U.S. Appl. No. 11/910,610.
Final Office Action dated Jan. 15, 2015 in U.S. Appl. No. 11/910,610.
Office Action dated May 22, 2013 in U.S. Appl. No. 11/910,610.
Korean Office Action dated Jun. 15, 2011 in Korean Patent Application No. 2009-7019285.
Annual Report 2004, Nippon Mining Holdings, 2004, pp. 25-27.
Annual Report 2005, Nippon Mining Holdings, 2005, pp. 27-29.
HA Foil, Super Flex Treated Rolled Copper Foil, Nippon Mining & Metals Co., Ltd, 2006.
Advisory Action dated Jan. 27, 2012 in U.S. Appl. No. 11/910,610.
Notice of Appeal filed Jan. 7, 2013 in U.S. Appl. No. 11/910,610.
Notice of Appeal filed Jun. 4, 2014 in U.S. Appl. No. 11/910,610.
Notice of Appeal filed Apr. 13, 2015 in U.S. Appl. No. 11/910,610.
Appeal Brief filed Feb. 19, 2013 in U.S. Appl. No. 11/910,610.
Appeal Brief filed Jun. 11, 2015 in U.S. Appl. No. 11/910,610.
Examiner's Answer dated Oct. 8, 2015 in U.S. Appl. No. 11/910,610.
Office Action dated Apr. 7, 2011 in U.S. Appl. No. 11/910,610.

* cited by examiner

COPPER CLAD LAMINATE

CROSS-REFERENCE TO RELATED APPLICATIONS

This application is a continuation application of U.S. application Ser. No. 11/910,610, filed Oct. 3, 2007, which was the U.S. National Phase Application under 35 U.S.C. § 371 of International Application No. PCT/JP2006/307122, filed Apr. 4, 2006, designating the U.S. and published as WO/2006/107043 A1 on Oct. 12, 2006, which claimed the benefit of Japanese Patent Application No. 2005-107408, filed Apr. 4, 2005. Any and all applications for which a foreign or a domestic priority is claimed is/are identified in the Application Data Sheet filed herewith and is/are hereby incorporated by reference in their entirety under 37 C.F.R. § 1.57.

BACKGROUND

Technical Field

The present invention relates to a highly flexible copper-clad laminate wherein a copper foil is laminated onto a polyimide film.

Background Art

A polyimide film has been used for a laminated sheet, a flexible printed-circuit board and so forth, because of its excellent heat resistance, chemical resistance, mechanical strength, electric properties and so on.

For example, a commonly used flexible printed circuit board (FPC) is a copper-clad laminate wherein a copper foil is laminated on one side or both sides of a polyimide film (Patent documents 1-3). A polyimide film used generally has a thickness of about 25 μm as the Examples in Patent documents 1-3.

At present, a copper-clad laminate, typically a substrate for electronic parts, requires excellent mechanical properties and higher flexibility. In particular, when a copper-clad laminate is applied to a hinge, it is needed to be highly flexible. However, a conventional copper-clad laminate comprising a polyimide film with a thickness of about 25 μm may not be adequately flexible.

Furthermore, a polyimide film may not have sufficiently adhesive properties. For improving its adhesiveness, it undergoes surface processing such as alkaline treatment, corona treatment, sandblasting and low-temperature plasma treatment, for example. Although being effective for improving adhesiveness, however, these methods require the use of an adhesive other than a polyimide, for example, an epoxy resin adhesive, leading to deterioration in heat resistance of the flexible substrate as a whole.

Thus, there has been proposed, as a polyimide film, a thermocompression-bonding multilayer polyimide film wherein thin layers of a thermoplastic polyimide are laminated on both sides of a heat-resistant polyimide layer.

However, when this thermocompression-bonding multilayer polyimide film has a smooth surface, it has a larger friction against a roll, for example, during film formation in which the film is winded onto a wind-up roll or during lamination with a copper foil, causing troubles such as wrinkle formation and twisting around a roll, which may restrict winding. Accordingly, there are needs to improve the surface slipping property of a polyimide film.

Examples of a method used for improving surface slipping property of a polyimide film include surface treatment such as embossing, and methods to reduce a surface friction coefficient by dispersing an inorganic powder such as calcium phosphate (Patent document 1) and silica (Patent document 2) in a polyimide film to form minute protrusions on the film surface. Alternatively, there has been proposed a method for manufacturing a polyimide film, by flow casting, from a solution of a polyamic acid polymerized in a solvent in which a fine inorganic filler is dispersed (Patent document 3).

However, the first method of surface treatment has a drawback that the appearance of the film is apt to be impaired due to excessive roughness formed of the film surface. In the second method wherein an inorganic powder is mixed with a solution of a polyamic acid to prepare a polyimide film, it is difficult to disperse the inorganic powder in the polyamic acid solution homogeneously, without using a special dispersing device. Thus, in this method, undispersed inorganic powder may remain as a lump, and thereby a prominent protrusion may be formed on the surface of the film obtained. In the third method, similarly, it is difficult to disperse a fine-particulate inorganic powder homogeneously, and the use of an inorganic powder with a larger particle size may lead to the same problem as that encountered in the second method.

Therefore, when these methods in which inorganic fillers are added are applied to a copper-clad laminate for a COF requiring a fine pattern, a protrusion on a thermoplastic polyimide surface may hinder the formation of fine pitches.

LIST OF REFERENCES

Patent document 1: Japanese Laid-open Patent Publication No. 1987-68852;

Patent document 2: Japanese Laid-open Patent Publication No. 1987-68853;

Patent document 3: Japanese Laid-open Patent Publication No. 1994-145378.

SUMMARY

Problems to be Solved by the Invention

An objective of the present invention is to provide a highly flexible copper-clad laminate. Another objective of the present invention is to provide a highly flexible copper-clad laminate exhibiting improved slipping property and sliding property of a polyimide film surface and having satisfactory appearance.

Means for Solving the Problems

The present invention relates to the followings.

[1] A copper-clad laminate prepared by laminating a copper foil on one side or both sides of a polyimide film by thermocompression bonding, wherein the polyimide film has a thickness of 5 to 20 μm, and the copper foil has a thickness of 1 to 18 μm.

[2] The copper-clad laminate as described in [1], wherein the polyimide film comprises a heat-resistant polyimide layer and a thermoplastic polyimide layer; and the copper foil is laminated on one side or both sides of the heat-resistant polyimide layer via the thermoplastic polyimide layer by thermocompression bonding.

[3] The copper-clad laminate as described in [1], wherein the polyimide film has a thickness of 5 to 15 μm.

[4] The copper-clad laminate as described in [1], wherein the copper foil is a rolled copper foil having a thickness of 8 to 18 μm.

[5] The copper-clad laminate as described in [4], wherein the copper foil is a rolled copper foil having a thickness of 10 to 18 µm.

[6] The copper-clad laminate as described in [5], wherein the copper foil is a rolled copper foil having a thickness of 10 to 12 µm.

[7] The copper-clad laminate as described in [1], wherein the copper foil is a rolled copper foil having a tensile strength before heat treatment of 300 N/mm$^2$ or more, and a ratio of tensile strength after heat treatment at 180° C. for 1 hour as defined by the following equation (1) of 33% or less:

$$\text{Ratio of tensile strength after heat treatment (\%)} = [(\text{tensile strength after heat treatment})/(\text{tensile strength before heat treatment})] \times 100 \qquad (1)$$

[8] The copper-clad laminate as described in [1], wherein the copper foil is a copper foil with a carrier, in which the copper foil after peeling off the carrier has a thickness of 1 to 5 µm.

[9] A copper-clad laminate prepared by peeling off the carrier from the copper-clad laminate as described in [8] and then plating it with copper to a thickness of the copper foil of 5 to 8 µm.

[10] The copper-clad laminate as described in [1], exhibiting MIT folding endurance of about 2000 times or more.

[11] The copper-clad laminate as described in [9], exhibiting MIT folding endurance of about 2000 times or more.

[12] The copper-clad laminate as described in [1], wherein the polyimide film is a thermocompression-bonding multilayer polyimide film having a thermoplastic polyimide layer on one side or both sides of a heat-resistant polyimide layer.

[13] The copper-clad laminate as described in [12], wherein polyimide particles are dispersed in the thermoplastic polyimide layer.

[14] The copper-clad laminate as described in [13], wherein the thermoplastic polyimide layer has polyimide particles with a median size of 0.3 to 0.8 µm and the maximum size of 2 µm or less dispersed within at least a depth of 0.5 µm from its surface in a ratio of about 0.5 to 10% by weight relative to the polyimide in the polyimide surface layer, and is substantially free from an inorganic powder, and the polyimide film has a friction coefficient of 0.05 to 0.7.

[15] The copper-clad laminate as described in [13], wherein the polyimide particles are prepared from a pyromellitic acid component and a p-phenylenediamine component.

[16] The copper-clad laminate as described in [12], wherein the polyimide film comprises a thermoplastic polyimide layer with a thickness of 1 to 6 µm on both sides of a heat-resistant polyimide layer with a thickness of 3 to 18 µm.

[17] The copper-clad laminate as described in [12], prepared by laminating the thermocompression-bonding multilayer polyimide film and the copper foil by thermocompression bonding under pressure at a temperature of a glass transition temperature of the thermoplastic polyimide to 400° C. both inclusive.

[18] The copper-clad laminate as described in [12], wherein the thermocompression-bonding multilayer polyimide film is formed by disposing a thermocompression-bonding polyimide layer on one side or both sides of a heat-resistant polyimide layer and integrating them by coextrusion-flow casting method.

[19] The copper-clad laminate as described in [1] used for a whole polyimide hinge.

[20] A copper-clad laminate prepared by laminating a copper foil with a thickness of 18 µm or less on a thermocompression-bonding multilayer polyimide film with a thickness of 5 to 25 µm, wherein the thermocompression-bonding multilayer polyimide film has a thermoplastic polyimide layer, in which polyimide particles are dispersed, on at least one side of a heat-resistant polyimide layer.

[21] A process for continuously manufacturing a copper-clad laminate by laminating a copper foil with a thickness of 1 to 18 µm on a polyimide film with a thickness of 5 to 20 µm, which has a thermoplastic polyimide layer on one side or both sides of a heat-resistant polyimide layer, by thermocompression bonding, comprising:

continuously feeding the polyimide film and the copper foil into a laminating machine such that the copper foil is disposed on the thermoplastic polyimide layer of the polyimide film; and laminating them by thermocompression bonding under pressure at a temperature of a glass transition temperature of the thermoplastic polyimide to 400° C. both inclusive.

Herein, MIT folding endurance is determined in accordance with JIS-C6471, and is the number of folding times when an electric resistance increases by 20% or more from an initial value under the conditions of a curvature radius of 0.8 mm, a load of 4.9 N, a folding speed of 175 times/min and a right and left folding angle of 135° using a copper-clad laminate having a copper circuit formed on one side as defined in the above test method.

A tensile strength of a copper foil is determined in accordance with JIS-C6515, at a cross-head speed of 2 mm/min, using a test piece prepared as defined in the test method.

A ratio of tensile strength after heat treatment (%) is calculated by the equation (1):

$$\text{Ratio of tensile strength after heat treatment (\%)} = [(\text{tensile strength after heat treatment})/(\text{tensile strength before heat treatment})] \times 100 \qquad (1)$$

Effect of the Invention

A copper-clad laminate of the present invention is prepared by laminating a copper foil with a thickness of 1 to 18 µm on one side or both sides of a polyimide film with a thickness of 5 to 20 µm by thermocompression bonding. A thickness of the polyimide film is preferably 5 to 15 µm. The copper foil is preferably a rolled copper foil with a thickness of 12 µm or less, particularly 10 to 12 µm. By making the polyimide film and the copper foil thinner as above, the very high flexibility may be achieved. For example, when a thickness of the polyimide film was reduced from 25 µm to 15 µm, an MIT folding endurance was approximately doubled or more in both MD and TD. When a thickness of the copper foil was reduced from 18 µm to 12 µm without changing a thickness of the polyimide film, an MIT folding endurance was increased in both MD and TD.

Particularly, when a copper foil used is a rolled copper foil having a tensile strength before heat treatment of 300 N/mm$^2$ or more, and a ratio of tensile strength after heat treatment at 180° C. for 1 hour as defined by the above equation (1) of 33% or less, the flexibility may be improved more significantly by making the polyimide film and the copper foil thinner.

A copper-clad laminate of the present invention preferably has an MIT folding endurance of about 2000 times or more in both MD and TD, and the MIT folding endurance can be increased to about 3000 times or more, about 3700 times or more, about 4000 times or more, about 5000 times or more, and furthermore about 7000 times or more by selecting thicknesses of the polyimide film and the copper foil, and the type of the copper foil.

On the other hand, when the copper foil and the polyimide film are thinner, there may be formed wrinkles in a part contacting a roller during the lamination step for preparing a long copper-clad laminate, leading to a reduced yield due to defective appearance after lamination. Particularly, when using a thin polyimide film having a thickness of 25 μm or less, it is difficult to continuously manufacture a copper-clad laminate in the light of feeding properties.

A thermocompression-bonding multilayer polyimide film having a thermoplastic polyimide layer in which polyimide particles are dispersed on one side or both sides of a heat-resistant polyimide layer may be used as a polyimide film, to improve slipping property of the surface of the polyimide film and to eliminate defective appearance such as wrinkles in the copper-clad laminate obtained as checked over the whole length. Particularly, the thermoplastic polyimide layer preferably contains polyimide particles with a median size of 0.3 to 0.8 μm and the maximum size of 2 μm or less dispersed within at least a depth of 0.5 μm, more preferably 0.7 μm from its surface in a ratio of about 0.5 to 10% by weight relative to the polyimide in the polyimide surface layer, and does not contain an inorganic powder substantially. When using this polyimide film with a thickness of 25 μm or less, a copper-clad laminate without any defect in appearance may be obtained.

DETAILED DESCRIPTION

Figure 1:
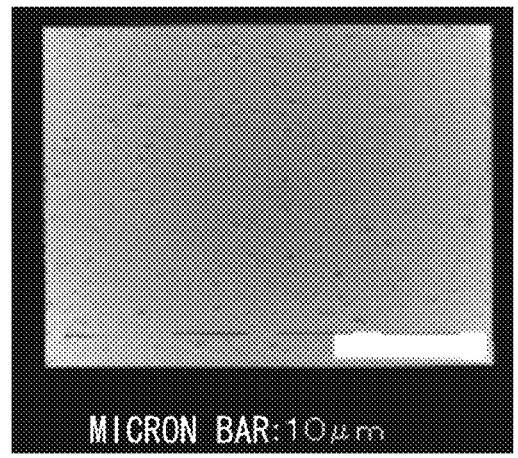
FIG. 1 shows the SEM photographic observations (×2000) of the surface of the polyimide film prepared in Example 1.

Best Mode for Carrying Out the Invention
1. Polyimide Film Used in a Copper-clad Laminate of the Present Invention A polyimide film used in the present invention has a thickness of 5 to 20 μm. A thickness of the polyimide film is preferably 5 to 18 μm, more preferably 5 to 15 μm. Using a thin polyimide film having a thickness of 20 μm or less, preferably 18 μm or less, particularly 15 μm or less, the flexibility of a copper-clad laminate is significantly improved. This effect is not limited to a particular polyimide film, but can be achieved in any polyimide film.

Examples of a polyimide film may include, but not limited to, polyimide films used as a material for electronic parts such as a printed circuit board, a flexible printed-circuit board and a TAB tape, and polyimides prepared from an acid component and a diamine component in the above polyimide film, or containing an acid component and a diamine component in the above polyimide film.

A polyimide film used in the present invention preferably has at least one of the following properties.

1) A glass transition temperature is 300° C. or higher, preferably 330° C. or higher, and further preferably, a glass transition temperature is undetectable.

2) A linear expansion coefficient (50 to 200° C.) (MD) is close to a thermal expansion coefficient of a metal foil such as a copper foil laminated on the polyimide film. Specifically, when using a copper foil as a metal foil, a thermal expansion coefficient of the polyimide film is preferably $5\times10^{-6}$ to $28\times10^{-6}$ cm/cm/° C., more preferably $9\times10^{-6}$ to $20\times10^{-6}$ cm/cm/° C., further preferably $12\times10^{-6}$ to $18\times10^{-6}$ cm/cm/° C.

3) A tensile modulus (MD, ASTM-D882) is 300 kg/mm$^2$ or more, preferably 500 kg/mm$^2$ or more, further preferably 700 kg/mm$^2$ or more.

Preferable examples of the polyimide film include polyimide films comprising a heat-resistant polyimide layer and a thermoplastic polyimide layer, and thermocompression-bonding multilayer polyimide films having a thermoplastic polyimide layer on one side or both sides of a heat-resistant polyimide layer. The thermoplastic polyimide layer gives a surface on which a copper foil is thermocompression-bonded; and therefore, the polyimide film used for a double-sided copper-clad laminate has a thermoplastic polyimide layer on both sides of a heat-resistant polyimide layer, while the polyimide film used for a single-sided copper-clad laminate has a thermoplastic polyimide layer on one side of a heat-resistant polyimide layer.

A glass transition temperature of the polyimide in the thermoplastic polyimide layer is lower than that of the heat-resistant polyimide, preferably 170 to 370° C., more preferably 170 to 320° C., particularly preferably 190 to 300° C.

The heat-resistant polyimide layer preferably has a thickness of about 3 to 18 μm, and the thermoplastic polyimide layer preferably has a thickness of about 1 to 6 μm.

The polyimide in the heat-resistant polyimide layer has a glass transition temperature higher than that of the thermoplastic polyimide layer, preferably 300° C. or higher, more preferably 320° C. or higher, and particularly preferably, it is a highly heat-resistant polyimide whose glass transition temperature is undetectable at 350° C. or higher.

As described above, although a reduction in thickness of the polyimide film may lead to the excellent flexibility, it may lead to more defects in appearance, including wrinkles, of the copper-clad laminate obtained. In view of improving slipping property of the polyimide film surface and enhancing the appearance of the copper-clad laminate, it is preferable that polyimide particles are dispersed in the surface of the polyimide film or the thermoplastic polyimide layer. Particularly preferably, polyimide particles with a median size of 0.3 to 0.8 μm and the maximum size of 2 μm or less are dispersed within at least a depth of 0.5 μm, preferably 0.7 μm from the surface of the polyimide film or the thermoplastic polyimide layer, in a ratio of about 0.5 to 10% by weight relative to the polyimide in the polyimide surface layer. The surface of the polyimide film or the thermoplastic polyimide layer may contain or be substantially free from an inorganic powder.

A thermocompression-bonding multilayer polyimide film in which a thermoplastic polyimide layer contains polyimide particles can be prepared by, for example, the following process. First, by coextrusion-flow casting method, on a support are flow-casted a polyamic acid solution composition containing a polyamic acid which gives a thermoplastic polyimide having a glass transition temperature of 170 to 320° C. and the polyimide particles described above, and a polyamic acid solution containing a polyamic acid which gives a polyimide core layer made of a heat-resistant polyimide (heat-resistant polyimide layer), such that the total thickness may be 5 to 20 μm, and then it is dried to form a self-supporting film. The self-supporting film thus obtained may be removed from the support, and heated for solvent removal and imidization to give a polyimide film. A content of the polyamic acid in the polyamic acid solution composition for the thermoplastic polyimide layer may be 16 to 22% by weight, while a content of the polyimide particles may be 0.5 to 10% by weight, preferably 0.5 to 5% by weight relative to the polyamic acid. A content of the polyamic acid in the polyamic acid solution for the heat-resistant polyimide layer may be 16 to 22% by weight.

Alternatively, a thermocompression-bonding multilayer polyimide film in which a thermoplastic polyimide layer contains polyimide particles may be prepared as follows. First, on a support is flow-casted a polyamic acid solution which gives a polyimide core layer made of a heat-resistant polyimide (heat-resistant polyimide layer), and then it is dried to form a self-supporting film. Its final thickness is preferably about 3 to 18 µm. Next, on at least one side of the resulting self-supporting film is applied a polyamic acid solution composition for a surface layer containing a polyamic acid which gives a thermoplastic polyimide having a glass transition temperature of 170 to 370° C. and the polyimide particles described above in a ratio of 0.5 to 10% by weight, preferably 0.5 to 5% by weight relative to the polyamic acid, such that the thickness after drying may be about 1 µm or more, and then it is dried. If necessary, the polyamic acid solution composition for a surface layer is applied to another surface such that the thickness after drying may be about 1 µm or more. Then, it is heated for solvent removal and imidization to give a polyimide film.

A thermocompression-bonding multilayer polyimide film in which a thermoplastic polyimide layer does not contain polyimide particles can be prepared as described above, except that the polyimide particles are not added to the polyamic acid solution composition for a surface layer, and a content of the polyamic acid is adjusted as appropriate.

Examples of a polyimide for a thermoplastic polyimide layer may include a tape material for electronic parts such as a printed circuit board, a flexible printed-circuit board, a TAB tape and a COF substrate, and any of known polyimides capable of bonding a heat-resistant polyimide to a copper foil by thermal compression or by thermal compression under pressure.

A preferable polyimide for a thermoplastic polyimide layer may be a thermocompression-bonding polyimide which can be bonded to a copper foil at a temperature of a glass transition temperature of the thermocompression-bonding polyimide to 400° C. both inclusive.

A polyimide for a thermoplastic polyimide layer may be a polyimide prepared from (1) an acid component comprising at least one selected from acid dianhydrides such as 3,3',4,4'-biphenyltetracarboxylic acid dianhydride, 2,3,3',4'-biphenyltetracarboxylic acid dianhydride, pyromellitic acid dianhydride, 3,3',4,4'-benzophenonetetracarboxylic acid dianhydride, bis(3,4-dicarboxyphenyl) ether dianhydride, bis(3,4-dicarboxyphenyl) sulfide dianhydride, bis(3,4-dicarboxyphenyl) sulfone dianhydride, bis(3,4-dicarboxyphenyl) methane dianhydride, 2,2-bis(3,4-dicarboxyphenyl) propane dianhydride, and 1,4-hydroquinone dibenzoate-3,3',4,4'-tetracarboxylic acid dianhydride, preferably an acid component comprising at least 70 mol % or more, more preferably 80 mol % or more, further preferably 90 mol % or more of these acid ingredients, and (2) a diamine component comprising at least one selected from diamines such as 1,3-bis(4-aminophenoxy)benzene, 1,3-bis(3-aminophenoxy)benzene, 1,4-bis(4-aminophenoxy)benzene, 3,3'-diaminobenzophenone, 4,4'-bis(3-aminophenoxy) biphenyl, 4,4'-bis(4-aminophenoxy) biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, and 2,2-bis[4-(4-aminophenoxy)phenyl]propane, preferably a diamine component comprising at least 70 mol % or more, more preferably 80 mol % or more, further preferably 90 mol % or more of these diamine ingredients.

An example of a combination of an acid component and a diamine component to give a polyimide for a thermoplastic polyimide layer may be a combination of (1) an acid component comprising at least one acid dianhydride selected from 3,3',4,4'-biphenyltetracarboxylic acid dianhydride and 2,3,3',4'-biphenyltetracarboxylic acid dianhydride, preferably an acid component comprising at least 70 mol % or more, more preferably 80 mol % or more, further preferably 90 mol % or more of these acid ingredients, and (2) a diamine component comprising at least one diamine selected from 1,3-bis(4-aminophenoxy)benzene, 1,3-bis(3-aminophenoxy)benzene, 4,4'-bis(3-aminophenoxy) biphenyl, bis[4-(3-aminophenoxy)phenyl]sulfone, bis[4-(3-aminophenoxy)phenyl]ether, 2,2-bis[4-(3-aminophenoxy)phenyl]propane and 2,2-bis[4-(4-aminophenoxy)phenyl]propane, preferably a diamine component comprising at least 70 mol % or more, more preferably 80 mol % or more, further preferably 90 mol % or more of these diamine ingredients.

As a diamine component to give a polyimide for a thermoplastic polyimide layer, in addition to the diamine components described above, a diamine component such as m-phenylenediamine, 3,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl) propane and 2,2-di(4-aminophenyl) propane may be used, as long as the features of the present invention are not deteriorated.

Specific examples of a polyimide for a thermoplastic polyimide layer may include a thermal-adhesive polyimide prepared by copolymerizing 1,3-bis(4-aminophenoxy)benzene, and 2,3,3',4'-biphenyltetracarboxylic acid dianhydride and 3,3',4,4'-biphenyltetracarboxylic acid dianhydride in a ratio (molar ratio) of 20/80 to 80/20, and a polyimide prepared by polymerizing 4,4-diaminodiphenyl ether and 3,3',4,4'-biphenyltetracarboxylic acid dianhydride.

In addition, specific examples of a polyimide for a thermoplastic polyimide layer may include a polyimide prepared by polymerizing, or imidizing an aromatic tetracarboxylic acid dianhydride such as 3,3',4,4'-benzophenonetetracarboxylic acid dianhydride, 2,2-bis(3,4-dicarboxyphenyl) propane dianhydride, bis(3,4-dicarboxyphenyl) methane dianhydride and bis(3,4-dicarboxyphenyl) ether dianhydride, and an aromatic diamine such as 1,3-bis(4-aminophenoxy)benzene and 1,3-bis(3-aminophenoxy)benzene.

A polyimide for a thermoplastic polyimide layer preferably has at least one of the following properties.

1) A thermocompression-bonding polyimide (S2) is a polyimide having a peel strength between a metal foil and the polyimide (S2) of 0.7 N/mm or more, and the retention of a peel strength after heat treatment at 150° C. for 168 hours of 90% or more, further 95% or more, particularly 100% or more.

2) A polyimide film of this polyimide has a tensile modulus of 100 to 700 Kg/mm² by itself.

3) A polyimide film of this polyimide has a linear expansion coefficient (50 to 200° C.) (MD) of 13 to 30×10⁻⁶ cm/cm/° C. by itself.

A preferable polyimide for a heat-resistant polyimide layer may be a heat-resistant polyimide constituting a base film used as a tape material for electronic parts such as a printed circuit board, a flexible printed-circuit board, a TAB tape and a COF substrate.

A heat-resistant polyimide for a heat-resistant polyimide layer may be a polyimide prepared from (1) an acid component comprising at least one selected from 3,3',4,4'-biphenyltetracarboxylic acid dianhydride, pyromellitic acid dianhydride and 1,4-hydroquinone dibenzoate-3, 3',4,4'-tetracarboxylic acid dianhydride, preferably an acid component comprising at least 70 mol % or more, more preferably 80 mol % or more, further preferably 90 mol % or more of these acid ingredients, and (2) a diamine component comprising at least one selected from p-phenylenediamine, 4,4'-diaminodiphenyl ether, m-tolidine and 4,4'-diaminobenzanilide, preferably a diamine component comprising at least 70 mol % or more, more preferably 80 mol % or more, further preferably 90 mol % or more of these diamine ingredients.

Examples of a combination of an acid component and a diamine component to give a heat-resistant polyimide may include combinations of 1) 3,3',4,4'-biphenyltetracarboxylic acid dianhydride, and p-phenylenediamine, or p-phenylenediamine and 4,4-diaminodiphenyl ether, 2) 3,3',4,4'-biphenyltetracarboxylic acid dianhydride and pyromellitic acid dianhydride, and p-phenylenediamine, or p-phenylenediamine and 4,4-diaminodiphenyl ether, 3) pyromellitic acid dianhydride, and p-phenylenediamine and 4,4-diaminodiphenyl ether, and 4) 3,3',4,4'-biphenyltetracarboxylic acid dianhydride and p-phenylenediamine, as main components (50 mol % or more in the total of 100 mol %). The polyimides prepared from the above combinations are used as a material for electronic parts such as a printed circuit board, a flexible printed-circuit board and a TAB tape. These polyimides are preferable, because they have excellent mechanical properties over a wide temperature range, long-term heat resistance, high resistance to hydrolysis, a high heat-decomposition initiation temperature, a low heat shrinkage ratio, a low linear expansion coefficient, and high flame resistance.

As an acid component to give a heat-resistant polyimide for a heat-resistant polyimide layer, in addition to the acid components described above, an acid dianhydride component such as 2,3,3',4'-biphenyltetracarboxylic acid dianhydride, 3,3',4,4'-benzophenonetetracarboxylic acid dianhydride, bis(3,4-dicarboxyphenyl) ether dianhydride, bis(3,4-dicarboxyphenyl) sulfide dianhydride, bis(3,4-dicarboxyphenyl) sulfone dianhydride, bis(3,4-dicarboxyphenyl) methane dianhydride, 2,2-bis(3,4-dicarboxyphenyl) propane dianhydride, 2,2-bis(3,4-dicarboxyphenyl)-1,1,1,3,3,3-hexafluoropropane dianhydride and 2,2-bis[(3,4-dicarboxyphenoxy)phenyl] propane dianhydride may be used, as long as the features of the present invention are not deteriorated.

As a diamine component to give a heat-resistant polyimide for a heat-resistant polyimide layer, in addition to the diamine components described above, a diamine component such as m-phenylenediamine, 3,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl) propane and 2,2-di(4-aminophenyl) propane may be used, as long as the features of the present invention are not deteriorated.

A example of a polyimide for a heat-resistant polyimide layer may be a polyimide prepared from 3,3',4,4'-biphenyltetracarboxylic acid dianhydride (hereinafter, sometimes simply referred to as "s-BPDA") and para-phenylenediamine (hereinafter, sometimes simply referred to as "PPD") and optionally 4,4'-diaminodiphenyl ether (hereinafter, sometimes simply referred to as "DADE"). In this case, a ratio of PPD/DADE (molar ratio) is preferably 100/0 to 85/15.

Another example of a polyimide for a heat-resistant polyimide layer may be a polyimide prepared from pyromellitic acid dianhydride (hereinafter, sometimes simply referred to as "PMDA"), or aromatic tetracarboxylic acid dianhydrides of 3,3',4,4'-biphenyltetracarboxylic acid dianhydride and pyromellitic acid dianhydride, and an aromatic diamine such as benzene diamine and biphenyldiamine. Preferable examples of the aromatic diamine may include para-phenylenediamine, an aromatic diamine having a ratio of PPD/DADE in 90/10 to 10/90, and meta-tolidine. In this case, a ratio of BPDA/PMDA is preferably 0/100 to 90/10.

Another example of a polyimide for a heat-resistant polyimide layer may be a polyimide prepared from pyromellitic acid dianhydride, para-phenylenediamine and 4,4'-diaminodiphenyl ether. In this case, a ratio of DADE/PPD is preferably 90/10 to 10/90.

A polyimide for a heat-resistant polyimide layer may have at least one, or at least two [combinations of 1) and 2), 1) and 3), and 2) and 3)], or all of the following features.

1) A polyimide film of this polyimide has a glass transition temperature of 300° C. or higher, preferably 330° C. or higher, and further preferably, a glass transition temperature is undetectable.

2) A polyimide film of this polyimide preferably has a linear expansion coefficient (50 to 200° C.) (MD) close to a thermal expansion coefficient of a metal foil such as a copper foil laminated on the polyimide film. Specifically, when using a copper foil as a metal foil, a thermal expansion coefficient of a polyimide film is preferably 5×10⁻⁶ to 28×10⁻⁶ cm/cm/° C., more preferably 9×10⁻⁶ to 20×10⁻⁶ cm/cm/° C., further preferably 12×10⁻⁶ to 18×10⁻⁶ cm/cm/° C.

3) A polyimide film of this polyimide has a tensile modulus (MD, ASTM-D882) of 300 kg/mm² or more, preferably 500 kg/mm² or more, further preferably 700 kg/mm² or more.

A polyamic acid solution to give a heat-resistant polyimide may be prepared by polymerizing an aromatic diamine and an aromatic tetracarboxylic acid dianhydride which give a heat-resistant polyimide in an organic polar solvent in accordance with the usual method.

Examples of such an organic polar solvent include amide type solvents such as N,N-dimethylformamide, N,N-dimethylacetamide, N-methyl-2-pyrrolidone and N-methylcaprolactam; dimethyl sulfoxide; hexamethylphosphoamide; dimethyl sulfone; tetramethylene sulfone; dimethyltetramethylene sulfone; pyridine; and ethylene glycol.

In the above process, preferably a polyamic acid solution is flow-casted and applied on a smooth support surface such as a stainless mirror surface and a stainless belt surface, and then it is heated at 100 to 200° C. to a semi-cured state or a dried state before the semi-curing. If a flow-casted film is treated at a temperature higher than 200° C., adhesiveness tends to decrease in preparation of a thermoplastic polyimide film. The semi-cured state or the state before the semi-curing means a self-supporting state after heating and/or chemical imidization.

A polyamic acid solution composition for forming a thermoplastic polyimide layer contains a polyamic acid solution which gives a thermoplastic polyimide having a glass transition temperature of 170 to 320° C., preferably 190 to 300° C., and polyimide particles. A ratio of the polyimide particles to the polyamic acid is preferably 0.5 to 10% by weight, particularly 0.5 to 5% by weight. A preferable polyimide particle is a wholly aromatic polyimide particle containing a pyromellitic acid component and a p-phenylenediamine component in 80% or more, and having a median size of 0.3 to 0.8 μm and the maximum size of 2 μm or less.

For preparing a wholly aromatic polyimide particle, to the above organic polar solvent is added an equimolar mixture of an aromatic diamine component comprising at least 80% of p-phenylenediamine, and an aromatic tetracarboxylic acid component comprising at least 80% of pyromellitic acid dianhydride, and if necessary, a dispersing agent, and then the resulting mixture is heated to about 160° C. with stirring in an atmosphere of an inert gas such as nitrogen gas, and further heated at the temperature for about 2 to 5 hours, and cooled, to give a mixture solution comprising the wholly aromatic polyimide particles. In general, the aromatic diamine component and the aromatic tetracarboxylic acid component may be added to a polar solvent such that the mixture contains a polyimide in 3 to 10% by weight. As polyimide particles, the mixture solution thus obtained may be preferably used without any treatment, or used after removing or adding the polar solvent, if necessary.

The wholly aromatic polyimide particles with a median size of 0.3 to 0.8 μm and the maximum size of 2 μm or less may be easily prepared when using an aromatic diamine component comprising at least 80% of p-phenylenediamine, and an aromatic tetracarboxylic acid component comprising at least 80% of pyromellitic acid dianhydride. When using the polyimide particles having a particle size within the above range, it is easy to form minute protrusions in the surface of the thermoplastic polyimide layer, which is suitable for a copper-clad laminate required to have a fine pattern.

The term "median size" as used herein means a particle size corresponding to 50% accumulative value in a cumulative distribution curve.

Therefore, the polyimide particles may be spherical, or alternatively cylindrical, dumbbell-shaped or oval with a ratio of the major axis to the minor axis of about 2 to 10, particularly about 3 to 6. When they are cylindrical, dumbbell-shaped or oval, they preferably have a minor axis of 0.05 to 0.5 μm and a major axis of 0.7 to 1.5 μm.

When a copper-clad laminate does not need to have a fine pattern, wholly aromatic polyimide particles with a median size of 0.3 to 10 μm can be used.

The above constitution can provide a thermocompression-bonding multilayer polyimide film having the improved slipping property; which comprises a substantially inorganic powder-free polyimide surface layer made of a thermoplastic polyimide having a glass transition temperature of 170 to 320° C., particularly 190 to 300° C.; and has a static friction coefficient and a dynamic friction coefficient of 0.05 to 0.7, preferably 0.1 to 0.7; and does not have any prominent protrusions formed on the film surface.

A thermocompression-bonding multilayer polyimide film used in the present invention has at least one thermal-adhesive side, and a thickness of 5 to 20 μm. By combining the polyimide film having a thickness of 5 to 20 μm with a copper foil having a thickness of 18 μm or less, there can be provided a copper-clad laminate having improved flexibility and exhibiting MIT folding endurance of about 2000 times or more, preferably in both MD and TD.

Furthermore, when a thermocompression-bonding multilayer polyimide film has a thermoplastic polyimide layer containing the polyimide particles, the slipping property of the surface of the polyimide film is so improved to give a long copper-clad laminate which can be readily winded onto a wind-up roll at a rate of 1 m/min or higher and which has no defect in appearance including wrinkles as checked over the whole length. For obtaining a copper-clad laminate having good appearance, it is effective to use a thermocompression-bonding multilayer polyimide film having a thermoplastic polyimide layer containing the polyimide particles, without being restricted to a thickness of 20 μm or less.

2. Copper Foil Used in a Copper-clad Laminate of the Present Invention

A copper foil used in the present invention has a thickness of 1 to 18 μm, particularly 3 to 18 μm. A thickness of the copper foil is preferably 12 μm or less.

A copper foil may be a rolled copper foil, an electrolytic copper foil, or the like, and when using a rolled copper foil, a superior copper-clad laminate may be obtained. Alternatively, a copper foil with a carrier can be used.

A preferable range of a thickness of a copper foil depends on the type of the copper foil used. For a rolled copper foil, a thickness is preferably 8 to 18 μm, more preferably 10 to 18 μm, particularly preferably 10 to 12 μm. For an electrolytic copper foil, a thickness is preferably 7 to 12 μm, more preferably 9 to 12 μm.

A copper foil preferably has an Rz, which indicates surface roughness, of 3 μm or less, more preferably 2 μm or less, particularly preferably 0.5 to 1.5 μm. When an Rz is small, a copper foil may be used after surface treatment.

Examples of such a copper foil may include a rolled copper foil (Microhard Corporation, VSBK, 18 μm), a rolled copper foil (Microhard Corporation, VSRD, 12 μm), a rolled copper foil (Hitachi Cable, Ltd., HPF-ST12-E, 12 μm), a rolled copper foil (Nikko Materials Co., Ltd., BHY-13H-T, 18 μm), a rolled copper foil (Nikko Materials Co., Ltd., BHY-22B-T, 12 μm), a rolled copper foil (Fukuda Metal Foil & Powder Co., Ltd., RCF-T4X, 12 μm), a rolled copper foil (Hitachi Cable, Ltd., HPF-ST10-E, 10 μm), a rolled copper foil (Nikko Materials Co., Ltd., BHY-13H-HA, 18 μm), a rolled copper foil (Nikko Materials Co., Ltd., BHY-22B-HA, 12 μm), an electrolytic copper foil (Nippon Denkai, Ltd., HLB, 12 μm), an electrolytic copper foil (Nippon Denkai, Ltd., HLB, 9 μm) and an electrolytic copper foil (Nippon Denkai, Ltd., HLS, 9 μm).

A preferable rolled copper foil has a tensile strength before heat treatment of 300 N/mm² or more, and a ratio of tensile strength after heat treatment at 180° C. for 1 hour as defined by the above equation (1) of 33% or less. When using such a rolled copper foil, a highly flexible copper-clad laminate may be obtained, and the marked effect of the present invention may be achieved, that is, thinning of a polyimide and a copper foil may more remarkably improve flexibility. Examples of such a rolled copper foil may include a rolled copper foil (Nikko Materials Co., Ltd., BHY-13H-HA) and a rolled copper foil (Nikko Materials Co., Ltd., BHY-22B-HA).

A preferable electrolytic copper foil has a tensile strength before heat treatment of 300 N/mm$^2$ or more, and a ratio of tensile strength after heat treatment at 180° C. for 1 hour as defined by the above equation (1) of 60% or less.

A preferable copper foil with a carrier is that prepared by bonding an ultrathin copper foil having a thickness of 1 to 5 μm to a metallic or ceramic carrier with a heat-resistant bonding agent. An example of the carrier may be a copper foil having a thickness of about 12 to 35 μm, particularly 12 to 18 μm. A specific example of the ultrathin copper foil with a carrier may be an electrolytic copper foil with a carrier (Nippon Denkai, Ltd., YSNAP-3B, thin copper foil thickness: 3 μm, carrier copper foil thickness: 18 μm).

A copper foil with a carrier is used after peeling off the carrier from the copper-clad laminate obtained, and then thickening the copper foil to a given level, for example 5 to 8 μm, by electrolytic plating.

3. Copper-clad Laminate of the Present Invention and Manufacturing Process Therefor A copper-clad laminate of the present invention is prepared by laminating a copper foil with a thickness of 1 to 18 μm on one side or both sides of a polyimide film with a thickness of 5 to 20 μm described above by thermocompression bonding. By combining the polyimide film having a thickness of 5 to 20 μm with a copper foil having a thickness of 1 to 18 μm, there can be provided a copper-clad laminate having the improved flexibility and exhibiting an MIT folding endurance of about 2000 times or more, preferably in both MD and TD.

A copper-clad laminate of the present invention preferably has a total thickness of 51 μm or less, particularly preferably 39 μm or less for a double-sided copper-clad laminate. It is preferably 33 μm or less, particularly preferably 27 μm or less for a single-sided copper-clad laminate.

A copper-clad laminate of the present invention can be prepared by laminating a copper foil on one side or both sides of a thermocompression-bonding multilayer polyimide film by thermocompression bonding or thermocompression bonding-cooling under pressure, using a continuous laminating machine such as a laminating rolls and a double-belt press, for example.

It is preferable to pre-heat a thermocompression-bonding multilayer polyimide film alone, or alternatively, a thermocompression-bonding multilayer polyimide film and a copper foil at about 150 to 250° C., particularly at a temperature higher than 150° C. and below 250° C. for about 2 to 120 sec in line immediately before introducing into a continuous laminating machine. Pre-heating can be conducted using a pre-heater such as a hot-air blower and an infrared heating unit. The term "in line" means an apparatus arrangement that a pre-heater is placed between a feeder of a raw material and a thermocompression-bonding unit in a continuous laminating machine such that thermocompression bonding is conducted immediately after pre-heating. It is also preferable to place a protective material between a thermocompression-bonding multilayer polyimide film and/or a copper foil and a belt or a roller during lamination. In this way, a copper foil can be laminated on at least one side of a heat-resistant polyimide layer via a thermocompression-bonding polyimide layer, to give a copper-clad laminate without any defect in product-appearance which has high dimensional stability (dimensional stability is 0.1% or less).

The above-described double-belt press is a laminating machine capable of conducting high-temperature heating-cooling under pressure, and a hydraulic-press type using a heat medium is preferable.

In-line pre-heating allows prevention of a decrease in a product yield due to defects in appearance of a laminate caused by foaming by water absorbed from the air into a polyimide after lamination, or foaming when immersed in a solder bath for forming an electronic circuit. Although it might be contemplated that a whole laminating machine is placed in a furnace, it is impractical because it is substantially limited to a compact laminating machine, leading to the restriction on the shape of the copper-clad laminate. If out-line pre-heating may be conducted, a polyimide may absorb water before lamination, leading to defective appearance of a laminate caused by foaming and reduction in solder heat-resistance.

A copper-clad laminate of the present invention may be preferably prepared by conducting the thermocompression bonding under pressure while a temperature in a heating and compression-bonding zone of a roll laminator or double-belt press is higher by 20° C. or more than a glass transition temperature of a thermocompression-bonding polyimide (in the above multilayer polyimide film, the polyimide in the thermoplastic polyimide layer) and below 400° C., particularly higher by 30° C. or more than the glass transition temperature and below 400° C., and then, in the case of a double-belt press, cooling the product under pressure in a cooling zone to a temperature lower by 20° C. or more, particularly by 30° C. or more than the glass transition temperature of the thermocompression-bonding polyimide, to laminate the copper foil on one side or both sides of the polyimide film.

When a product is a single-sided copper-clad laminate having a metal foil on one side of a polyimide film, a protective material can be used, and a protective material may be laminated on the side of the polyimide film without a thermocompression-bonding polyimide layer and a copper foil, and after lamination, the protective material may be removed from the laminate and rolled up, or alternatively the product may be rolled up together with the protective material which is removed before use. Examples of a protective material used may include an easily peelable and highly heat-resistant film, for example, a highly heat-resistant film with an Rz of less than 2 μm, and a metal foil. The preferable protective materials may include a highly heat-resistant resin film such as a polyimide film (for example, Ube Industries, Ltd., UPILEX-S) and a fluororesin film, and a metal foil such as a rolled copper foil having the improved surface smoothness with minimal surface roughness.

By thermocompression bonding-cooling under pressure using a double-belt press to lamination, in particular, preferably a drawing rate can be 1 m/min or more, and there can be provided a long and wide copper-clad laminate having a width of about 400 mm or more, particularly about 500 mm or more, and high adhesive strength (90° peel strength: 0.7 N/mm or more, particularly 1 N/mm or more) and such good appearance that substantially no wrinkles are observed in the metal foil surface. When using a double-belt press, a copper-clad laminate obtained has the improved uniformity of dimensional change, and preferably, a percentage of dimensional-change is 0.1% or less at room temperature (merely drying after etching) and 150° C. (heating after etching) in both MD and TD as an average of L, C and R in the width direction (the left end, the center and the right end, respectively, in the direction that the film is wound off).

In an aspect of the present invention, a polyimide film and a copper foil are separately fed into a roll laminator or double-belt press as a rolled sheet, and a copper-clad laminate is obtained as a rolled sheet.

A copper-clad laminate provided by the present invention can be used as a substrate for electronic parts after various processings such as rolling up, etching and optionally uncurling, and subsequently cutting into a given size. For example, it may be suitably used as a substrate for an FPC, a multilayer FPC and a flex-rigid substrate. In particular, a multilayer substrate meeting the requirements of higher heat resistance, lower water absorption, lower dielectric constant and improved electric properties can be provided, by bonding a plurality of (for example, 2 to 10 layers) single-sided copper-clad laminates (the total thickness is 8 to 38 μm) or double-sided copper-clad laminates (the total thickness is 11 to 56 μm) in which a copper foil has a thickness of 3 to 18 μm and a polyimide film layer has a thickness of 5 to 20 μm, with a heat-resistant polyimide adhesive (thickness: 5 to 12 μm).

A copper-clad laminate of the present invention include a laminate obtained by cutting a long one into a given size (reducing a width or length) as well as a long laminate.

A copper-clad laminate of the present invention may be prepared by a known method other than the above lamination method. For example, it can be prepared by any of the following methods.

(1) On a copper foil is flow-casted or applied a solution of a polyamic acid as a polyimide precursor, and then, if necessary, it is dried and/or imidized and then, if necessary, heated.

(2) On a copper foil is flow-casted or applied a solution of a thermoplastic polyimide precursor, and then, if necessary, it is dried and/or imidized, and subsequently, on the thermoplastic polyimide layer is flow-casted or applied a solution of a heat-resistant polyimide precursor, and then it is imidized and then, if necessary, heated.

(3) On a copper foil is flow-casted or applied a solution of a thermoplastic polyimide precursor, and then, if necessary, it is dried and/or imidized, and subsequently, on the thermoplastic polyimide layer is flow-casted or applied a solution of a heat-resistant polyimide precursor, and then, if necessary, it is dried and/or imidized, and subsequently, on the heat-resistant polyimide layer is flow-casted or applied a solution of a thermoplastic polyimide precursor, and then, if necessary, it is dried and/or imidized and then, if necessary, heated.

In addition, a copper-clad laminate prepared by further laminating a copper foil on the one-side laminated polyimide film obtained by the above methods (1) to (3), and a laminate prepared by laminating two of one-side laminated polyimide films obtained by the above methods (1) to (3), for example (1) and (2), (1) and (1), and (2) and (2), can be used.

In this specification, a friction coefficient of a polyimide film, which indicates slipping property, is evaluated as follows.

In accordance with the method described in ASTM-D1894, a friction coefficient is determined by a dynamic slip tester (load: 200 g, sliding rate: 150 mm/min), using, as a substrate, one side of a moisture-controlled polyimide film maintained at 23° C. and 60% RH for 24 hours, which are attached to a sled metal (6 cm×6 cm) such that the same side may be joined together. A value when a chart begins to fluctuate is a static friction coefficient, while a value when a chart becomes stable is a dynamic friction coefficient.

In this specification, unless otherwise stated, MIT folding endurance of a polyimide film and a copper-clad laminate is evaluated as follows.

Unless otherwise stated, MIT folding endurance (a copper-clad laminate) is determined in accordance with JIS C6471; specifically, it is the number of folding times when an electric resistance increases by 20% or more from an initial value under the conditions of a curvature radius of 0.8 mm, a load of 4.9 N, a folding speed of 175 times/min and a right and left folding angle of 135° using a copper-clad laminate having a copper circuit formed on one side as defined in the above test method. In terms of sampling, 10 test pieces are prepared from the whole width, and an average of the measured values for these is determined to be an MIT folding endurance.

Processability is evaluated by visual observation for the formation of a wrinkle in a feeding line between a feeder and a press when a polyimide film is fed at a rate of 2 m/min, and the absence and the presence of wrinkles are expressed as ○ and x, respectively.

An appearance of a copper-clad laminate is evaluated by observing, using a CCD camera, the presence of wrinkles over the whole length of a long copper-clad laminate winded onto a wind-up roll (an outer diameter of an axle is 15 cm) at a rate of 2 m/min, and the absence and the presence of defects in appearance due to wrinkles are expressed as ○ and x, respectively.

A size of a particulate polyimide is determined as follows.

Using N,N-dimethylacetamide as a dispersion medium, polyimide particles are dispersed for 60 min by ultrasonic agitation, and a particle size by volume is determined over a measurement range of 0.02 to 1000 μm by laser diffraction/scattering particle-size distribution measurement method. A slurry solution obtained in the preparation of the particulate polyimide is subjected to dispersion by an ultrasonic cleaner for 60 min. In a measurement cell is placed a dispersion medium, to which is then added drop by drop the dispersed slurry solution for dilution so that the transmission of the laser beam lamp is 95 to 75%. And then, the determination is conducted by manual batch cell measurement.

Apparatus: a laser diffraction/scattering particle-size distribution measurement device (model: LA-910, HORIBA, Ltd.);

Measurement mode: manual batch cell measurement.

A shape of a particulate polyimide is determined by SEM observation of the particulate polyimide on a glass plate.

The other properties of a polyimide film are evaluated as follows.

1) Glass transition temperature (Tg) of a polyimide film: determined from a peak tan δ value by a dynamic viscoelasticity method (tensile method; frequency: 6.28 rad/sec; temperature rising rate: 10° C./min).

2) Linear expansion coefficient (50 to 200° C.) of a polyimide film: an average linear expansion coefficient at 20 to 200° C. is determined by a TMA method (tensile method; temperature rising rate: 5° C./min).

3) Volume resistance of a polyimide film: determined in accordance with ASTM-D257.

4) Mechanical properties of a polyimide film

Tensile strength: determined in accordance with ASTM-D882 (cross-head speed: 50 mm/min).

Elongation percentage: determined in accordance with ASTM-D882 (cross-head speed: 50 mm/min).

Tensile modulus: determined in accordance with ASTM-D882 (cross-head speed: 5 mm/min).

5) MIT folding endurance (polyimide film) is determined in accordance with JIS-C6471; specifically, it is the number of folding times at the rupture of the polyimide film under the conditions of a curvature radius of 0.38 mm, a load of 9.8 N, a folding speed of 175 times/min and a right and left folding angle of 135° using a test piece having a width of 15 mm which is cut from the film over the whole width.

EXAMPLES

The present invention will be more specifically described with reference to the following Examples and Comparative Examples. However, the present invention is not limited to these Examples.

Reference Example 1

Preparation Example of a Particulate Polyimide

A particulate polyimide used was prepared by dissolving p-phenylenediamine and pyromellitic acid dianhydride in N,N'-dimethylacetamide, adding a dispersing agent (dispersant: 0.5% by weight relative to the monomers), and then gradually heating the resulting mixture to 160° C. in a nitrogen atmosphere with stirring (40 rpm), and after reaching the temperature, stirring the mixture for 3 hours. The particle-size distribution of the particulate polyimide obtained was determined by a laser diffraction/scattering particle-size distribution measurement device, and as a result, the median size was 0.3 μm and the distribution range was 0.1 to 1 μm. Furthermore, the shape of the particulate polyimide was determined by SEM observation, and as a result, they were cylindrical particles with a ratio of a major axis to a minor axis of 3 to 6.

Reference Example 2

Preparation Example of a Thermocompression-bonding Multilayer Polyimide Film Having Improved Slipping Property To N-methyl-2-pyrrolidone were added para-phenylenediamine (PPD) and 3,3',4,4'-biphenyltetracarboxylic acid dianhydride (s-BPDA) in a molar ratio of 1000:998 such that a monomer concentration was 18% (by weight, the same shall apply hereinafter), and then the mixture was reacted at 50° C. for 3 hours, to give a polyamic acid solution having a solution viscosity of about 1500 poise at 25° C. (a dope for a heat-resistant polyimide). Separately, to N-methyl-2-pyrrolidone were added 1,3-bis(4-aminophenoxy)benzene (TPE-R) and 2,2',3,3'-biphenyltetracarboxylic acid dianhydride (a-BPDA) in a molar ratio of 1000:1000 such that a monomer concentration was 22%, and further was added triphenyl phosphate in 0.1% by weight relative to the monomers, and then the mixture was reacted at 5° C. for one hour. To the resulting polyamic acid solution having a solution viscosity of about 2000 poise at 25° C. was added the particulate polyimide obtained in Reference Example 1 in 4.0% by weight relative to a monomer concentration, to give a dope (a dope for a thermoplastic polyimide in a surface layer). The dopes for a heat-resistant polyimide and a thermoplastic polyimide thus obtained were flow-casted on a metal support, using a film-forming equipment provided with a three-layer extrusion molding die (multi-manifold type die) with varying a thickness of the three-layer extrusion die, and then it is continuously dried under hot air at 140° C., to form a solidified film. The solidified film was peeled off from the support, and gradually heated from 200° C. to 320° C. in a heating furnace for solvent removal and imidization, and the resulting long three-layer extruded polyimide film was winded onto a wind-up roll. The three-layer extruded polyimide film thus prepared had the following properties.

Figure 2:
FIG. 2 shows the SEM photographic observations (×2000) of the surface of the polyimide film prepared in Reference Example 2.

Thermocompression-bonding multilayer polyimide film:
Thickness pattern: 3 μm/9 μm/3 μm (total 15 μm),
Static friction coefficient: 0.37,
Tg of the thermoplastic aromatic polyimide: 260° C. (dynamic viscoelasticity method, tan δ peak value, the same shall apply hereinafter),
Tg of the heat-resistant polyimide in the core layer: 340° C. or higher,
Linear expansion coefficient (50 to 200° C.): 18 ppm/° C. (TMA method),
Tensile strength, elongation percentage: 460 MPa, 90% (ASTM D882),
Tensile modulus: 7080 MPa (ASTM D882),
MIT folding endurance: no ruptures until 100,000 times,
Volume resistance: $4 \times 10^{16}$ Ω·cm (ASTM D257).
FIG. 2 shows the SEM observation (×2000) of the surface of the polyimide film obtained.

Reference Example 3

Preparation Example of a Thermocompression-bonding Multilayer Polyimide Film

A long three-layer extruded polyimide film was winded onto a wind-up roll as described in Reference Example 2, except that no polyimide particles were added to a dope for a thermoplastic polyimide in a polyimide surface layer. The three-layer extruded polyimide film obtained had the following properties.

Thermocompression-bonding multilayer polyimide film:
Thickness pattern: 3 μm/9 μm/3 μm (total 15 μm),
Static friction coefficient: 1.00 or more.

Example 1

A set of two rolled-up rolled copper foils (tough pitch copper, Microhard Corporation, VSBK, thickness: 18 μm) and the thermocompression-bonding multilayer polyimide film (thickness: 15 μm) obtained in Reference Example 2, which was pre-heated by hot air at 200° C. for 30 sec in line immediately before a double-belt press, were laminated by continuous thermocompression bonding-cooling under the conditions of a heating zone temperature (the highest heating temperature): 330° C., a cooling zone temperature (the lowest cooling temperature): 180° C., a thermocompression-bonding pressure: 40 kg/cm² (3.9 MPa) and a thermocompression-bonding time: 2 min; and the copper-clad laminate as a rolled-up double-sided copper-clad laminate (width: 540 mm, length: 1000 m) was winded onto a wind-up roll. The evaluation results for the copper-clad laminate obtained are as follows.

MIT folding endurance: MD/TD=2210/2500,
Processability: ○,
Product appearance: ○.
FIG. 1 shows the SEM observation (×2000) of the surface of the polyimide film obtained.

Example 2

A rolled-up double-sided copper-clad laminate was winded onto a wind-up roll as described in Example 1, except that a set of two rolled-up rolled copper foils (tough pitch copper, Microhard Corporation, VSRD, thickness: 12 μm) were used. The evaluation results for the copper-clad laminate obtained are as follows.

MIT folding endurance: MD/TD=3100/3220,
Processability: ○,
Product appearance: ○.

Example 3

A rolled-up double-sided copper-clad laminate was winded onto a wind-up roll as described in Example 1, except that a set of two rolled-up rolled copper foils (tough pitch copper, Hitachi Cable, Ltd., HPF-ST10-E, thickness: 10 µm) were used. The evaluation results for the copper-clad laminate obtained are as follows.
MIT folding endurance: MD/TD=3210/3250,
Processability: ○,
Product appearance: ○.

Example 4

A rolled-up double-sided copper-clad laminate was winded onto a wind-up roll as described in Example 1, except that a set of two rolled-up electrolytic copper foils (Nippon Denkai, Ltd., HLB, thickness: 9 µm) were used. The evaluation results for the copper-clad laminate obtained are as follows.
MIT folding endurance: MD/TD=3210/3250,
Processability: ○,
Product appearance: ○.

Example 5

A rolled-up double-sided copper-clad laminate was winded onto a wind-up roll as described in Example 1, except that a set of two rolled-up electrolytic copper foils with a carrier copper foil (Nippon Denkai, Ltd., YSNAP-3B, carrier copper foil thickness: 18 µm, thin copper foil thickness: 3 µm) were used. The evaluation results for the copper-clad laminate obtained are as follows. MIT folding endurance was determined for a test piece prepared by peeling off the carrier copper foil and then electroplating it with copper to a thickness of the thin copper foil of 8 µm.
MIT folding endurance: MD/TD=2120/2160,
Processability: ○,
Product appearance: ○.

Example 6

A rolled-up double-sided copper-clad laminate was winded onto a wind-up roll as described in Example 1, except that the thermocompression-bonding multilayer polyimide film obtained in Reference Example 3, in which the thermoplastic polyimide layer contains no polyimide particles (thickness: 15 µm) was used, and the feeding rate was reduced by half. The copper-clad laminate obtained had an MIT folding endurance comparable to that in Example 1, and the evaluation results for its processability and product appearance were as follows.
Processability: x,
Product appearance: x.

Example 7

From the copper-clad laminate obtained in Example 4 was prepared a 90 µm-pitch hinge member. The hinge member obtained was bonded to a coverlay (polyimide layer thickness: 25 µm, adhesive layer thickness: 25 µm), and an MIT folding endurance test was conducted. The result was MD/TD=5000/4000, demonstrating that it had satisfactory properties as a hinge member. Furthermore, the hinge member obtained had excellent holding ability, and therefore was suitable for accordion-folding mounting.

The MIT folding endurance was determined in accordance with JIS C6471; specifically, it was determined under the conditions of a curvature radius of 0.38 mm, a load of 4.9 N, a folding speed of 175 times/min and a right and left folding angle of 135°.

Reference Example 4

The polyimide films used in Examples 8 to 14 and Comparative Examples 1 to 6 were prepared as follows.

To N-methyl-2-pyrrolidone were added para-phenylenediamine (PPD) and 3,3',4,4'-biphenyltetracarboxylic acid dianhydride (s-BPDA) in a molar ratio of 1000:998 such that a monomer concentration was 18% (by weight, the same shall apply hereinafter), and then the mixture was reacted at 50° C. for 3 hours, to give a polyamic acid solution having a solution viscosity of about 1500 poise at 25° C. (a dope for a heat-resistant polyimide). Separately, to N-methyl-2-pyrrolidone were added 1,3-bis(4-aminophenoxy)benzene (TPE-R), 2,3,3',4'-biphenyltetracarboxylic acid dianhydride (a-BPDA) and 3,3',4,4'-biphenyltetracarboxylic acid dianhydride (s-BPDA) in a molar ratio of 1000:200:800 such that a monomer concentration was 18%, and further was added triphenyl phosphate in 0.5% by weight relative to the monomers, and then the mixture was reacted at 40° C. for 3 hours. The polyamic acid solution thus prepared had a solution viscosity of about 1680 poise at 25° C. And then, the particulate polyimide obtained in Reference Example 1 was added in 4.0% by weight relative to a monomer concentration, to give a dope (a dope for a thermoplastic polyimide in a surface layer). The dopes for a heat-resistant polyimide and a thermoplastic polyimide thus obtained were flow-casted on a metal support, using a film-forming equipment provided with a three-layer extrusion molding die (multi-manifold type die) with varying a thickness of the three-layer extrusion die, and then it is continuously dried under hot air at 140° C., to form a solidified film. The solidified film was peeled off from the support, and gradually heated from 200° C. to 320° C. in a heating furnace for solvent removal and imidization, and the resulting long three-layer extruded polyimide film was winded onto a wind-up roll. The three-layer extruded polyimide film thus prepared had the following properties.

Thermocompression-bonding multilayer polyimide film (15 µm):
  Thickness pattern: 3 µm/9 µm/3 µm (total 15 µm),
  Static friction coefficient: 0.37,
  Tg of the thermoplastic aromatic polyimide: 240° C. (dynamic viscoelasticity method, tan δ peak value, the same shall apply hereinafter),
  Tg of the heat-resistant polyimide in the core layer: 340° C. or higher,
  Linear expansion coefficient (50 to 200° C.): 19 ppm/° C. (TMA method),
  Tensile strength, elongation percentage: 460 MPa, 90% (ASTM D882),
  Tensile modulus: 7080 MPa (ASTM D882),
  MIT folding endurance: no ruptures until 100,000 times,
  Volume resistance: $4 \times 10^{16}$ Ω·cm (ASTM D257).

Thermocompression-bonding multilayer polyimide film (20 µm):
  Thickness pattern: 3.5 µm/13 µm/3.5 µm (total 20 µm),
  Static friction coefficient: 0.36,
  Tg of the thermoplastic aromatic polyimide: 240° C., Tg of the heat-resistant polyimide in the core layer: 340° C. or higher,
Linear expansion coefficient (50 to 200° C.): 18 ppm/° C. (TMA method),
Tensile strength, elongation percentage: 510 MPa, 100% (ASTM D882),
Tensile modulus: 7140 MPa (ASTM D882),
MIT folding endurance: no ruptures until 100,000 times,
Volume resistance: $3\times10^{16}$ Ω·cm (ASTM D257).

Thermocompression-bonding multilayer polyimide film (25 μm):
Thickness pattern: 4 μm/17 μm/4 μm (total 25 μm),
Static friction coefficient: 0.39,
Tg of the thermoplastic aromatic polyimide: 240° C.,
Tg of the heat-resistant polyimide in the core layer: 340° C. or higher,
Linear expansion coefficient (50 to 200° C.): 18 ppm/° C. (TMA method),
Tensile strength, elongation percentage: 520 MPa, 105% (ASTM D882),
Tensile modulus: 7200 MPa (ASTM D882),
MIT folding endurance: no ruptures until 100,000 times,
Volume resistance: $4\times10^{16}$ Ω·cm (ASTM D257).

Example 8

A copper-clad laminate was prepared by laminating the polyimide film having a thickness of 15 μm obtained in Reference Example 4 and a set of two rolled copper foils (Nikko Materials Co., Ltd., BHY-13H-T, thickness: 18 μm) by thermocompression bonding as described below.

The polyimide film, which was pre-heated by hot air at 200° C. for 30 sec in line immediately before a double-belt press, and the rolled-up copper foils were laminated by continuous thermocompression bonding-cooling under the conditions of a heating zone temperature (the highest heating temperature): 330° C., a cooling zone temperature (the lowest cooling temperature): 180° C., a thermocompression-bonding pressure: 3.9 MPa, and a thermocompression-bonding time: 2 min; and the copper-clad laminate as a rolled-up double-sided copper-clad laminate (width: 540 mm, length: 1000 m) was winded onto a wind-up roll.

For the copper-clad laminate thus obtained, its MIT folding endurance was determined.

MIT folding endurance is determined in accordance with JIS C6471; specifically, it is the number of folding times when an electric resistance increases by 100% from an initial value under the conditions of a curvature radius of 0.8 mm, a load of 4.9 N, a folding speed of 175 times/min and a right and left folding angle of 135° using a copper-clad laminate having a copper circuit formed on one side as defined in the above test method. In terms of sampling, 10 test pieces are prepared from the whole width, and an average of the measured values for these is determined to be an MIT folding endurance.

The rolled copper foil used had a tensile strength before heat treatment of 450 N/mm² in MD and 433 N/mm² in TD, and a ratio of tensile strength after heat treatment at 180° C. for 1 hour as defined by the above equation (1) of 43% in MD and 40% in TD.

A tensile strength of a copper foil is determined in accordance with JIS C6515, at a cross-head speed of 2 mm/min, using a test piece prepared as defined in the test method. An average of the measured values for 5 test pieces is to be a tensile strength. A ratio of tensile strength after heat treatment (%) was calculated according to the equation (1):

$$\text{Ratio of tensile strength after heat treatment (\%)} = [(\text{tensile strength after heat treatment})/(\text{tensile strength before heat treatment})]\times100 \quad (1)$$

The results are shown in Table 1.

Comparative Example 1

A copper-clad laminate was prepared and its MIT folding endurance was determined as described in Example 8, except that the polyimide film used had a thickness of 25 μm. The results are shown in Table 1.

Example 9

A copper-clad laminate was prepared and its MIT folding endurance was determined as described in Example 8, except that a set of two rolled copper foils (Nikko Materials Co., Ltd., BHY-13H-HA, thickness: 18 μm) were used. The results are shown in Table 1.

The rolled copper foil used had a tensile strength before heat treatment of 421 N/mm² in MD and 437 N/mm² in TD, and a ratio of tensile strength after heat treatment at 180° C. for 1 hour as defined by the above equation (1) of 22% in MD and 20% in TD.

Comparative Example 2

A copper-clad laminate was prepared and its MIT folding endurance was determined as described in Example 9, except that the polyimide film used had a thickness of 25 μm. The results are shown in Table 1.

Example 10

A copper-clad laminate was prepared and its MIT folding endurance was determined as described in Example 8, except that a set of two rolled copper foils (Nikko Materials Co., Ltd., BHY-22B-T, thickness: 12 μm) were used. The results are shown in Table 1.

The rolled copper foil used had a tensile strength before heat treatment of 417 N/mm² in MD and 420 N/mm² in TD, and a ratio of tensile strength after heat treatment at 180° C. for 1 hour as defined by the above equation (1) of 44% in MD and 37% in TD.

Comparative Example 3

A copper-clad laminate was prepared and its MIT folding endurance was determined as described in Example 10, except that the polyimide film used had a thickness of 25 μm. The results are shown in Table 1.

Example 11

A copper-clad laminate was prepared and its MIT folding endurance was determined as described in Example 8, except that a set of two rolled copper foils (Nikko Materials Co., Ltd., BHY-22B-HA, thickness: 12 μm) were used. The results are shown in Table 1.

The rolled copper foil used had a tensile strength before heat treatment of 461 N/mm² in MD and 443 N/mm² in TD, and a ratio of tensile strength after heat treatment at 180° C. for 1 hour as defined by the above equation (1) of 21% in MD and 19% in TD.

Comparative Example 4

A copper-clad laminate was prepared and its MIT folding endurance was determined as described in Example 11, except that the polyimide film used had a thickness of 25 μm. The results are shown in Table 1.

TABLE 1

| | Copper foil | Tensile strength before heat treatment (N/mm²) | Ratio of tensile strength after heat treatment (%) | Thickness pattern (μm) Cu | Polyimide | Cu | MIT folding endurance MD | TD |
|---|---|---|---|---|---|---|---|---|
| Example 8 | BHY-13H-T | MD:450 TD:433 | MD:43 TD:40 | 18 | 15 | 18 | 1854 | 1748 |
| Comp. Example 1 | BHY-13H-T | MD:450 TD:433 | MD:43 TD:40 | 18 | 25 | 18 | 915 | 977 |
| Example 9 | BHY-13H-HA | MD:421 TD:437 | MD:22 TD:20 | 18 | 15 | 18 | 3807 | 3822 |
| Comp. Example 2 | BHY-13H-HA | MD:421 TD:437 | MD:22 TD:20 | 18 | 25 | 18 | 1270 | 1342 |
| Example 10 | BHY-22B-T | MD:417 TD:420 | MD:44 TD:37 | 12 | 15 | 12 | 2194 | 2991 |
| Comp. Example 3 | BHY-22B-T | MD:417 TD:420 | MD:44 TD:37 | 12 | 25 | 12 | 1150 | 1423 |
| Example 11 | BHY-22B-HA | MD:461 TD:443 | MD:21 TD:19 | 12 | 15 | 12 | 7483 | 7572 |
| Comp. Example 4 | BHY-22B-HA | MD:461 TD:443 | MD:21 TD:19 | 12 | 25 | 12 | 3029 | 2315 |

As seen from Table 1, a copper-clad laminate having a polyimide film with a thickness of 15 μm had much more improved MIT folding endurance than that of a copper-clad laminate having a polyimide film with a thickness of 25 μm. Furthermore, a copper-clad laminate having a thinner copper foil with a thickness of 12 μm had more improved MIT folding endurance.

Very excellent MIT folding endurance was observed in the copper-clad laminates obtained in Examples 9 and 11, which have a rolled copper foil having a tensile strength before heat treatment of 300 N/mm² or more, and a ratio of tensile strength after heat treatment at 180° C. for 1 hour as defined by the equation (1) of 33% or less.

Example 12

A copper-clad laminate was prepared and its MIT folding endurance was determined as described in Example 8, except that a set of two electrolytic copper foils (Nippon Denkai, Ltd., HLB, thickness: 12 μm) were used. The results are shown in Table 2.

The electrolytic copper foil used had a tensile strength before heat treatment of 504 N/mm² in MD and 512 N/mm² in TD, and a ratio of tensile strength after heat treatment at 180° C. for 1 hour as defined by the above equation (1) of 50% in MD and 49% in TD.

Example 13

A copper-clad laminate was prepared and its MIT folding endurance was determined as described in Example 12, except that the polyimide film used had a thickness of 20 μm. The results are shown in Table 2.

Comparative Example 5

A copper-clad laminate was prepared and its MIT folding endurance was determined as described in Example 12, except that the polyimide film used had a thickness of 25 μm. The results are shown in Table 2.

Example 14

A copper-clad laminate was prepared and its MIT folding endurance was determined as described in Example 8, except that a set of two electrolytic copper foils (Nippon Denkai, Ltd., HLB, thickness: 9 μm) were used. The results are shown in Table 2.

Comparative Example 6

A copper-clad laminate was prepared and its MIT folding endurance was determined as described in Example 14, except that the polyimide film used had a thickness of 25 μm. The results are shown in Table 2.

TABLE 2

| | Copper foil | Thickness pattern (μm) Cu | Polyimide | Cu | MIT folding endurance MD | TD |
|---|---|---|---|---|---|---|
| Example 12 | HLB | 12 | 15 | 12 | 2131 | 2037 |
| Example 13 | HLB | 12 | 20 | 12 | 1540 | 1441 |
| Comp. Example 5 | HLB | 12 | 25 | 12 | 1121 | 1126 |
| Example 14 | HLB | 9 | 15 | 9 | 3106 | 3081 |
| Comp. Example 6 | HLB | 9 | 25 | 9 | 1413 | 1410 |

As seen from Table 2, a copper-clad laminate having a thinner polyimide film had more improved MIT folding endurance. Furthermore, a copper-clad laminate having a thinner copper foil with a thickness of 9 μm had more improved MIT folding endurance.

What is claimed is:

1. A copper-clad laminate prepared by laminating a copper foil on one side or both sides of a polyimide film by thermocompression bonding, wherein the polyimide film has a thickness of 5 to 20 μm, and the copper foil has a thickness of 1 to 18 μm, wherein the polyimide film is a thermocompression-bonding multilayer polyimide film having a thermoplastic polyimide layer on one side or both sides of a heat-resistant polyimide layer, wherein the thermoplastic polyimide layer comprises a thermoplastic polyimide and polyimide particles with a median size of 0.3 to 0.8 μm and a maximum size of 2 μm or less dispersed within at least a depth of 0.5 μm from a surface of the thermoplastic polyimide layer in a ratio of about 0.5 to 10% by weight relative to the thermoplastic polyimide in the thermoplastic polyimide layer, wherein the polyimide particles are prepared from pyromellitic acid component and p-phenylenediamine component.

2. The copper-clad laminate as claimed in claim 1, wherein the polyimide film has a thickness of 5 to 15 μm.

3. The copper-clad laminate as claimed in claim 1, wherein the copper foil is a rolled copper foil having a thickness of 8 to 18 μm.

4. The copper-clad laminate as claimed in claim 1, wherein the copper foil is a rolled copper foil having a thickness of 10 to 18 μm.

5. The copper-clad laminate as claimed in claim 1, wherein the copper foil is a rolled copper foil having a thickness of 10 to 12 μm.

6. The copper-clad laminate as claimed in claim 1, wherein the copper foil is a rolled copper foil having a tensile strength before heat treatment of 300 N/mm$^2$ or more and 461 N/mm$^2$ or less, and a ratio of tensile strength after heat treatment at 180° C. for 1 hour as defined by the following equation (1) of 19% or more and 33% or less, $$\text{Ratio of tensile strength after heat treatment (\%)} = [(\text{tensile strength after heat treatment})/(\text{tensile strength before heat treatment})] \times 100 \quad (1).$$

7. The copper-clad laminate as claimed in claim 1, wherein the copper foil is a copper foil with a carrier, in which the copper foil after peeling off the carrier has a thickness of 1 to 5 μm.

8. A copper-clad laminate prepared by peeling off the carrier from the copper-clad laminate as claimed in claim 7 and then plating it with copper to a thickness of the copper foil of 5 to 8 μm.

9. The copper-clad laminate as claimed in claim 1, exhibiting MIT folding endurance of about 2000 times or more.

10. The copper-clad laminate as claimed in claim 8, exhibiting MIT folding endurance of about 2000 times or more.

* * * * *